United States Patent
Shido

(10) Patent No.: US 11,012,056 B2
(45) Date of Patent: May 18, 2021

(54) RING OSCILLATOR AND TIME MEASURING CIRCUIT

(71) Applicant: Winbond Electronics Corp., Taichung (TW)

(72) Inventor: Taihei Shido, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/857,184

(22) Filed: Apr. 24, 2020

(65) Prior Publication Data

US 2020/0395922 A1     Dec. 17, 2020

(30) Foreign Application Priority Data

Jun. 11, 2019   (JP) .............................. JP2019-108325

(51) Int. Cl.
| | | |
|---|---|---|
| H03K 3/03 | (2006.01) | |
| G04F 10/04 | (2006.01) | |
| G01R 31/317 | (2006.01) | |
| G11C 29/02 | (2006.01) | |

(52) U.S. Cl.
CPC ..... H03K 3/0315 (2013.01); G01R 31/31725 (2013.01); G04F 10/04 (2013.01); G11C 29/021 (2013.01); G11C 29/023 (2013.01)

(58) Field of Classification Search
CPC . G01R 31/31725; G04F 10/04; G11C 29/023; H03K 3/0315; H03K 3/0322
USPC .......................................................... 331/57
See application file for complete search history.

(56) References Cited

U.S. PATENT DOCUMENTS

| | | | |
|---|---|---|---|
| 5,251,228 A * | 10/1993 | Daniel ............. | G01R 31/31704 714/724 |
| 5,329,169 A | 7/1994 | Ihara | |
| 5,903,521 A | 5/1999 | Relph | |
| 6,232,845 B1 * | 5/2001 | Kingsley ................ | G01R 27/04 324/617 |
| 7,482,886 B1 * | 1/2009 | Kingsley .......... | G01R 31/31726 327/263 |
| 7,653,170 B2 | 1/2010 | Mattes et al. | |
| 9,240,247 B2 | 1/2016 | Tsuruta | |
| 2004/0070459 A1 | 4/2004 | Motoyama | |

(Continued)

FOREIGN PATENT DOCUMENTS

| | | |
|---|---|---|
| CN | 104101827 | 10/2014 |
| JP | H09294055 | 11/1997 |

(Continued)

OTHER PUBLICATIONS

"Office Action of Korea Counterpart Application", with English translation thereof, dated Apr. 20, 2020, p1-p7.

(Continued)

*Primary Examiner* — Levi Gannon
(74) *Attorney, Agent, or Firm* — JCIPRNET

(57) ABSTRACT

A ring oscillator including a plurality of flip-flops is provided. The flip-flops are connected in a ring. The flip-flops are configured to start to oscillate according to a start signal to generate an output signal, and stop oscillating according to a stop signal to stop generating the output signal. When the stop signal changes from a first level to a second level, the output signal becomes floating. In addition, a time measuring circuit including the foregoing ring oscillator is also provided.

8 Claims, 5 Drawing Sheets

(56) References Cited

U.S. PATENT DOCUMENTS

| | | | |
|---|---|---|---|
| 2004/0100336 A1 | 5/2004 | Christensen et al. | |
| 2011/0181337 A1* | 7/2011 | Otsuga ............. | G01R 31/31725 |
| | | | 327/332 |
| 2012/0262240 A1* | 10/2012 | Cremonesi ........... | H03K 23/542 |
| | | | 331/57 |

FOREIGN PATENT DOCUMENTS

| | | |
|---|---|---|
| JP | 2002116231 | 4/2002 |
| JP | 2010109154 | 5/2010 |
| JP | 2013066139 | 4/2013 |
| KR | 920015712 | 8/1992 |
| TW | I227320 | 2/2005 |
| TW | 201403619 | 1/2014 |

OTHER PUBLICATIONS

"Office Action of Japan Counterpart Application", dated Oct. 20, 2020, p1-p3.

\* cited by examiner

US 11,012,056 B2

RING OSCILLATOR AND TIME MEASURING CIRCUIT

CROSS-REFERENCE TO RELATED APPLICATION

This application claims the priority benefit of Japan application serial no. 2019-108325, filed on Jun. 11, 2019. The entirety of the above-mentioned patent application is hereby incorporated by reference herein and made a part of this specification.

BACKGROUND OF THE INVENTION

Field of the Invention

The disclosure relates to an electronic circuit and a measuring circuit, and more particularly, to a ring oscillator and a time measuring circuit.

Description of Related Art

FIG. 1 is a schematic view showing a memory cell and a sensing circuit thereof. FIG. 2 is a waveform diagram showing bit line voltages of FIG. 1. Referring to FIG. 1 and FIG. 2, a memory cell 110 of a dynamic random access memory (DRAM) is connected to a sensing circuit 120 via bit lines BLt and BLc. The sensing circuit 120 includes a sense amplifier SA. The bit lines BLt and BLc are charged to a voltage VBLH when on standby, and their level is about half of a voltage VBL. After the memory cell 110 is selected, in the time period of a sensing time t1 to t2, the charging charge in the memory cell 110 flows to the bit line BLt, so the voltage level of the bit line BLt rises. After discharge of the memory cell 110 is over, for example, at time point t2, the sensing circuit 120 amplifies and senses the voltage difference between the bit lines BLt and BLc to access the memory cell 110.

Generally, fast access to the memory cell is important in a DRAM design. Therefore, the sensing time t1 to t2 should be as short as possible to enable fast access to the memory cell. However, the sensing time t1 to t2 cannot be overly short, because the longer sensing time t1 to t2 can allow the sensing circuit 120 to sense a larger bit line voltage difference to ensure the correctness of data determination. Therefore, if the time length of the sensing time t1 to t2 can be measured, it will contribute to improvement of the process evaluation and circuit design.

SUMMARY OF THE INVENTION

The invention provides a ring oscillator and a time measuring circuit, which can accurately measure the sensing time of a memory cell.

A ring oscillator of the invention includes a plurality of flip-flops. The flip-flops are connected in a ring. The flip-flops are configured to start to oscillate according to a start signal to generate an output signal, and stop oscillating according to a stop signal to stop generating the output signal. When the stop signal changes from a first level to a second level, the output signal becomes floating.

A time measuring circuit of the invention includes a ring oscillator and a counter circuit. The ring oscillator is configured to start to oscillate according to a start signal to generate an output signal, and stop oscillating according to a stop signal to stop generating the output signal. When the stop signal changes from a first level to a second level, the output signal becomes floating. The counter circuit is coupled to the ring oscillator. The counter circuit is configured to receive and count the output signal to generate a count value as a time measurement result.

Based on the above, in the embodiments of the invention, when the stop signal changes from the first level to the second level, the output signal of the ring oscillator becomes floating and can latch the ring oscillator in the correct condition. Therefore, the time measuring circuit can accurately measure the sensing time of the memory cell.

To make the aforementioned more comprehensible, several embodiments accompanied with drawings are described in detail as follows.

DESCRIPTION OF THE EMBODIMENTS

Figure 3:
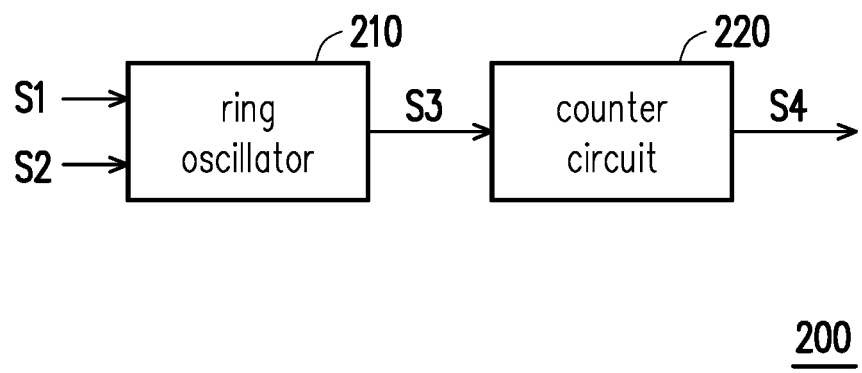
FIG. 3 is a schematic view showing a time measuring circuit according to an embodiment of the invention.

FIG. 3 is a schematic view showing a time measuring circuit according to an embodiment of the invention. Referring to FIG. 3, a time measuring circuit 200 of the present embodiment includes a ring oscillator 210 and a counter circuit 220. The counter circuit 220 is coupled to the ring oscillator 210. The ring oscillator 210 is configured to start to oscillate according to a start signal S1 to generate an output signal S3, and output the output signal S3 to the counter circuit 220. The counter circuit 220 receives and counts the output signal S3 to generate a count value as a time measurement result S4. Then, the ring oscillator 210 stops oscillating according to a stop signal S2 to stop generating the output signal S3 for the counter circuit 220. The counter circuit 220 thus stops counting. In the present embodiment, the counter circuit 220 may be implemented by the structure of any one counter circuit in the art and is not specifically limited in the invention. The implementation thereof may be sufficiently taught, suggested, and described according to the common knowledge in the art.

Figure 1:
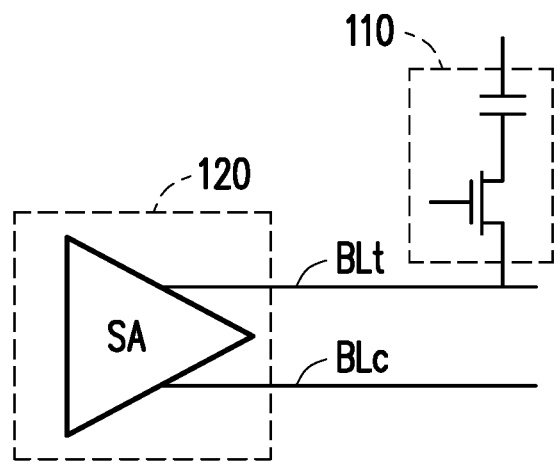
FIG. 1 is a schematic view showing a memory cell and a sensing circuit thereof according to an embodiment of the invention.
Figure 2:
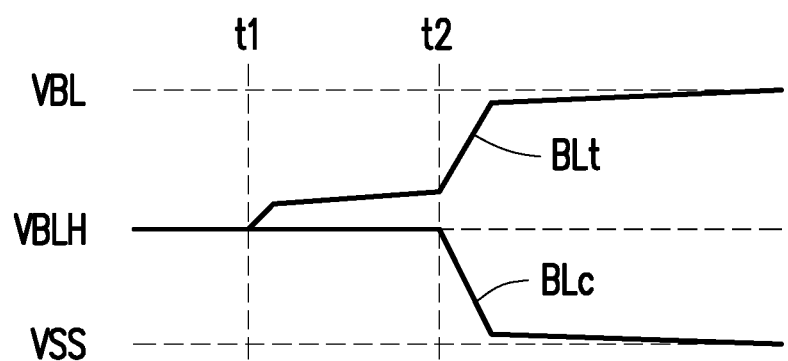
FIG. 2 is a waveform diagram showing bit line voltages of the embodiment of FIG. 1.

In the present embodiment, the time measuring circuit 200 is adapted, for example, to measure the sensing time t1 to t2 of FIG. 2. Therefore, the start signal S1 is generated corresponding to the start time t1 of the sensing time t1 to t2, and the stop signal S2 is generated corresponding to the end time t2 of the sensing time t1 to t2.

Figure 4:
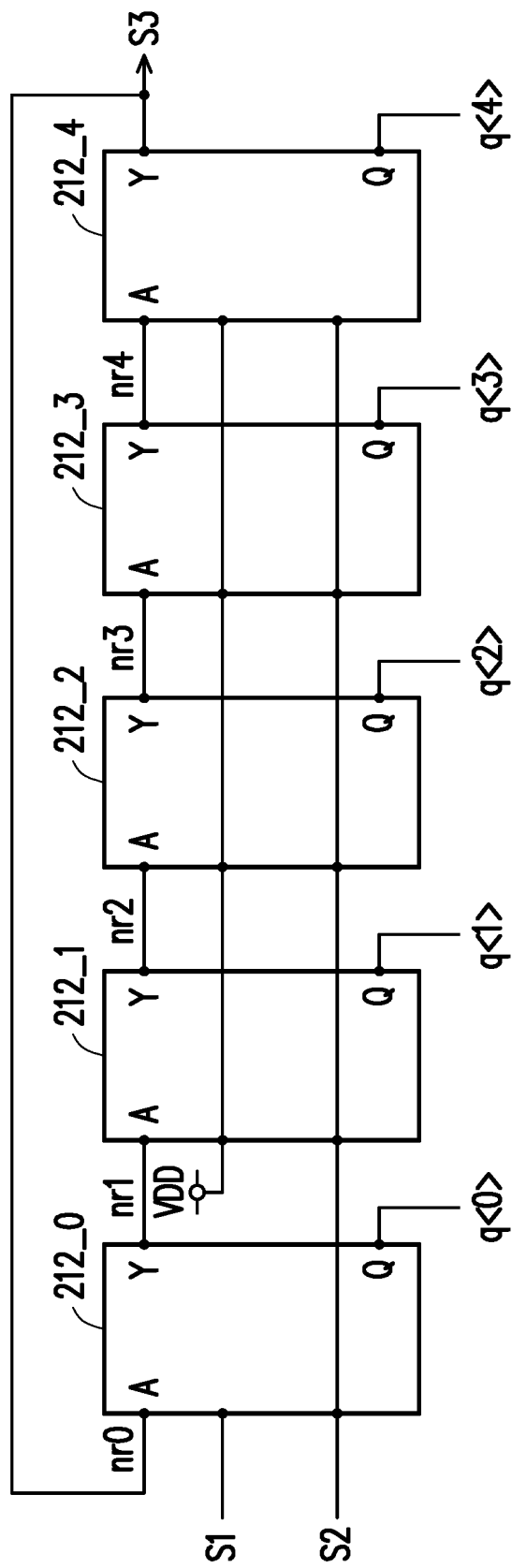
FIG. 4 is a schematic view showing a ring oscillator of the embodiment of FIG. 3.
Figure 5:
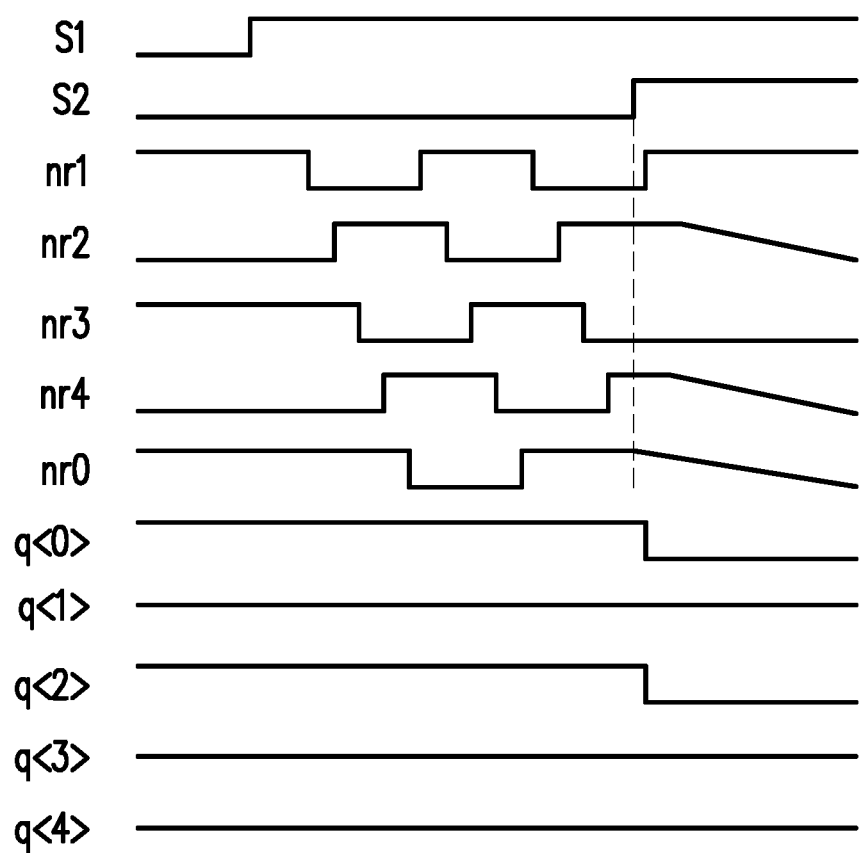
FIG. 5 is a waveform diagram showing signals in the ring oscillator of the embodiment of FIG. 4.

FIG. 4 is a schematic view showing the ring oscillator of the embodiment of FIG. 3. FIG. 5 is a waveform diagram showing signals in the ring oscillator of the embodiment of FIG. 4. Referring to FIG. 4 and FIG. 5, the ring oscillator 210 of the present embodiment includes a plurality of flip-flops 212_0 to 212_4. The flip-flops 212_0 to 212_4 are connected in a ring and may execute the function of the ring oscillator, and the number of the flip-flops is not used to limit the invention. Each flip-flop includes a first control terminal, a second control terminal, an input terminal A, a first output terminal Y, and a second output terminal Q. In the present embodiment, the first control terminal of a first flip-flop 212_0 is coupled to the start signal S1, and the second control terminal is coupled to the stop signal S2. The first control terminals of a plurality of second flip-flops 212_1 to 212_4 are coupled to a system high voltage VDD, and the second control terminals are coupled to the stop signal S2.

In the present embodiment, the input terminal of each flip-flop is coupled to the first output terminal of the previous-stage flip-flop, and the first output terminal of each flip-flop is coupled to the input terminal of the next-stage flip-flop. For example, the input terminal A of the flip-flop 212_0 is coupled to the first output terminal Y of the previous-stage flip-flop 212_4, and the first output terminal Y of the flip-flop 212_0 is coupled to the input terminal A of the next-stage flip-flop 212_1. The first output terminal of each flip-flop outputs an internal signal, and the second output terminal of each flip-flop outputs a data signal. For example, the first output terminals Y of the flip-flops 212_0, 212_1, 212_2, 212_3, and 212_4 respectively output internal signals nr1, nr2, nr3, nr4, and nr0, and the second output terminals Q of the flip-flops 212_0, 212_1, 212_2, 212_3, and 212_4 respectively output data signals q<0>, q<1>, q<2>, q<3>, and q<4>. In the present embodiment, the internal signal nr0 output by the last-stage flip-flop is used as the output signal S3. Namely, the internal signal nr0 output by the flip-flop 212_4 is used as the output signal S3.

In FIG. 5, the initial values of the internal signals nr0, nr1, nr2, nr3, and nr4 are respectively 1, 1, 0, 1, and 0, wherein the low level is 0 and the high level is 1. In the initial period, the internal signals nr0 and nr1 are both the second level (high level). When the start signal S1 changes from the first level (low level) to the second level (high level), the internal signal nr0 becomes 0, and the ring oscillator 210 starts to oscillate. Then, when the stop signal S2 changes from the first level (low level) to the second level (high level), the stop signal S2 latches the condition of the ring oscillator 210, and the output signal S3 (i.e., the internal signal nr0) becomes floating to remain at the high level. The floating means, for example, that the contact which outputs the output signal S3 is in the floating condition, or the output signal S3 is in the high impedance (Hi-Z) condition.

In the related art, since the internal signal of the ring oscillator is reset after receiving the stop signal, the ring oscillator cannot be suspended immediately. As a result, the time measuring circuit cannot accurately measure the sensing time of the memory cell. In the present embodiment, when the stop signal changes from the first level to the second level, the output signal of the ring oscillator becomes floating and can remain at the high level to latch the ring oscillator in the correct condition. Therefore, the time measuring circuit can accurately measure the sensing time of the memory cell.

Figure 6:
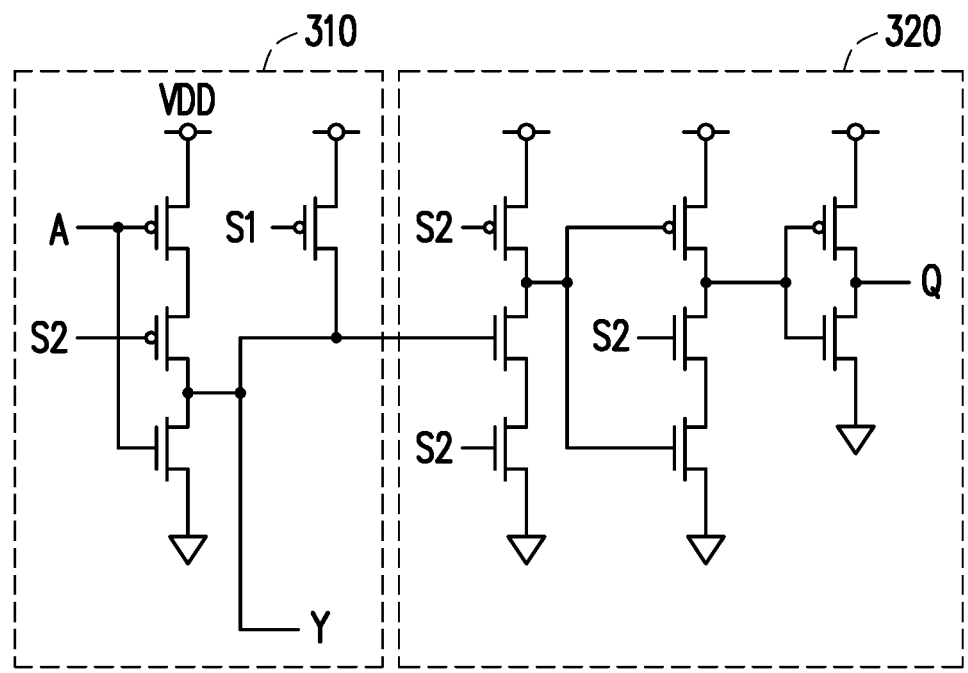
FIG. 6 is a schematic internal view showing a flip-flop according to an embodiment of the invention.

FIG. 6 is a schematic internal view showing a flip-flop according to an embodiment of the invention. Referring to FIG. 6, a flip-flop 212A of the present embodiment includes an internal signal generating circuit 310 and a data signal generating circuit 320. The internal signal generating circuit 310 is configured to generate an internal signal according to a start signal S1 and a stop signal S2, and the internal signal is output via the first output terminal Y to the next-stage flip-flop. The data signal generating circuit 320 is configured to generate a data signal according to the stop signal S2, and the data signal is output via the second output terminal Q.

Figure 7:
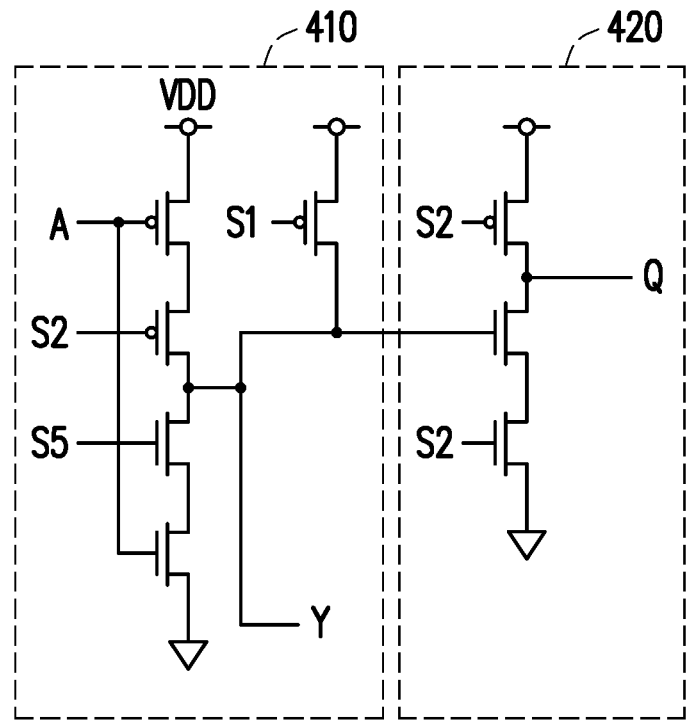
FIG. 7 is a schematic internal view showing a flip-flop according to another embodiment of the invention.

FIG. 7 is a schematic internal view showing a flip-flop according to another embodiment of the invention. Referring to FIG. 7, a flip-flop 212B of the present embodiment includes an internal signal generating circuit 410 and a data signal generating circuit 420. The internal signal generating circuit 410 is configured to generate an internal signal according to a start signal S1, a stop signal S2, and an inverted stop signal S5. The internal signal is output via the first output terminal Y to the next-stage flip-flop, and the inverted stop signal S5 is an inverted signal of the stop signal S2. The data signal generating circuit 420 is configured to generate a data signal according to the stop signal S2, and the data signal is output via the second output terminal Q.

In summary of the above, in the embodiments of the invention, when the stop signal changes from the first level to the second level, the output signal of the ring oscillator becomes floating and can remain at the high level to latch the ring oscillator in the correct condition. Therefore, the time measuring circuit can accurately measure the sensing time of the memory cell.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A ring oscillator comprising:
a plurality of flip-flops, connected in a ring and configured to start to oscillate according to a start signal to generate an output signal, and stop oscillating according to a stop signal to stop generating the output signal,
wherein when the stop signal changes from a first level to a second level, the output signal becomes floating,
wherein each of the flip-flops comprises a first control terminal and a second control terminal,
the first control terminal of a first flip-flop among the flip-flops is coupled to the start signal, and the second control terminal of the first flip-flop among the flip-flops is coupled to the stop signal, and
the first control terminals of a plurality of second flip-flops among the flip-flops are coupled to a system high voltage, and the second control terminals of the second flip-flops among the flip-flops are coupled to the stop signal.

2. The ring oscillator according to claim 1, wherein each of the flip-flops further comprises an input terminal, a first output terminal, and a second output terminal,
the input terminal of each of the flip-flops is coupled to the first output terminal of a previous-stage flip-flop, and the first output terminal of each of the flip-flops is coupled to the input terminal of a next-stage flip-flop, and
the first output terminal of each of the flip-flops outputs an internal signal, the second output terminal of each of the flip-flops outputs a data signal, and the internal signal output by a last-stage flip-flop among the flip-flops is used as the output signal.

3. The ring oscillator according to claim 1, wherein each of the flip-flops comprises:
an internal signal generating circuit, configured to generate an internal signal according to the start signal and the stop signal, wherein the internal signal output by a last-stage flip-flop among the flip-flops is used as the output signal; and a data signal generating circuit, coupled to the internal signal generating circuit and configured to generate a data signal according to the stop signal.

4. The ring oscillator according to claim 1, wherein each of the flip-flops comprises:
an internal signal generating circuit, configured to generate an internal signal according to the start signal, the stop signal, and an inverted stop signal, wherein the internal signal output by a last-stage flip-flop among the flip-flops is used as the output signal; and
a data signal generating circuit, coupled to the internal signal generating circuit and configured to generate a data signal according to the stop signal.

5. A time measuring circuit comprising:
a ring oscillator, configured to start to oscillate according to a start signal to generate an output signal, and stop oscillating according to a stop signal to stop generating the output signal, wherein when the stop signal changes from a first level to a second level, the output signal becomes floating; and
a counter circuit, coupled to the ring oscillator and configured to receive and count the output signal to generate a count value as a time measurement result,
wherein the ring oscillator comprises:
a plurality of flip-flops, connected in a ring and configured to start to oscillate according to the start signal to generate the output signal, and stop oscillating according to the stop signal to stop generating the output signal,
wherein each of the flip-flops further comprises an input terminal, a first output terminal, and a second output terminal,
the input terminal of each of the flip-flops is coupled to the first output terminal of a previous-stage flip-flop, and the first output terminal of each of the flip-flops is coupled to the input terminal of a next-stage flip-flop, and
the first output terminal of each of the flip-flops outputs an internal signal, the second output terminal of each of the flip-flops outputs a data signal, and the internal signal output by a last-stage flip-flop among the flip-flops is used as the output signal,
wherein each of the flip-flops comprises a first control terminal and a second control terminal,
the first control terminal of a first flip-flop among the flip-flops is coupled to the start signal, and the second control terminal of the first flip-flop among the flip-flops is coupled to the stop signal, and
the first control terminals of a plurality of second flip-flops among the flip-flops are coupled to a system high voltage, and the second control terminals of the second flip-flops among the flip-flops are coupled to the stop signal.

6. The time measuring circuit according to claim 5, wherein the time measuring circuit is adapted to measure a sensing time, the start signal is generated corresponding to a start time of the sensing time, and the stop signal is generated corresponding to an end time of the sensing time.

7. The time measuring circuit according to claim 5, wherein each of the flip-flops comprises:
an internal signal generating circuit, configured to generate the internal signal according to the start signal and the stop signal, wherein the internal signal output by a last-stage flip-flop among the flip-flops is used as the output signal; and
a data signal generating circuit, coupled to the internal signal generating circuit and configured to generate the data signal according to the stop signal.

8. The time measuring circuit according to claim 5, wherein each of the flip-flops comprises:
an internal signal generating circuit, configured to generate the internal signal according to the start signal, the stop signal, and an inverted stop signal, wherein the internal signal output by a last-stage flip-flop among the flip-flops is used as the output signal; and
a data signal generating circuit, coupled to the internal signal generating circuit and configured to generate the data signal according to the stop signal.

* * * * *